United States Patent
Wu et al.

(10) Patent No.: US 10,903,797 B2
(45) Date of Patent: Jan. 26, 2021

(54) BIAS CIRCUIT BASED ON BIFET TECHNOLOGY FOR SUPPLYING A BIAS CURRENT TO AN RF POWER AMPLIFIER

(71) Applicant: Rafael Microelectronics, Inc., Hsinchu County (TW)

(72) Inventors: Chih-Wen Wu, Hsinchu County (TW); Szu-Yao Chu, Hsinchu County (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 24 days.

(21) Appl. No.: 16/280,050

(22) Filed: Feb. 20, 2019

(65) Prior Publication Data

US 2020/0266767 A1    Aug. 20, 2020

(51) Int. Cl.
*H03F 3/04* (2006.01)
*H03F 1/02* (2006.01)
*H03F 3/213* (2006.01)
*H03F 1/30* (2006.01)

(52) U.S. Cl.
CPC ........... *H03F 1/0261* (2013.01); *H03F 3/213* (2013.01); *H03F 1/302* (2013.01); *H03F 2200/18* (2013.01); *H03F 2200/451* (2013.01)

(58) Field of Classification Search
CPC .. H03F 1/0261; H03F 3/213; H03F 2200/451; H03F 1/302; H03F 2200/18; H03F 1/301; H03G 3/3042; H03G 3/3047

USPC .................................................. 330/285, 296
See application file for complete search history.

(56) References Cited

U.S. PATENT DOCUMENTS

| | | | | |
|---|---|---|---|---|
| 6,946,911 B2* | 9/2005 | Yang | ........................ | H03F 1/302 330/285 |
| 7,129,786 B2* | 10/2006 | Kim | ........................ | H03F 1/025 330/297 |
| 7,876,157 B1* | 1/2011 | Kang | ..................... | H03F 1/0261 330/285 |
| 8,040,186 B2* | 10/2011 | Nakayama | .............. | H03F 3/189 330/133 |
| 9,077,291 B2* | 7/2015 | Sasaki | ........................ | H03F 3/21 |
| 10,027,320 B2* | 7/2018 | Won | ...................... | H03F 1/0266 |
| 2003/0112074 A1* | 6/2003 | Nishimura | ............ | H03G 1/0023 330/285 |

* cited by examiner

*Primary Examiner* — Khanh V Nguyen
(74) *Attorney, Agent, or Firm* — Min-Lee Teng; Litron Patent & Trademark Office

(57) ABSTRACT

A bias circuit for supplying a bias current to an RF power amplifier by using a field-effect transistor (FET) that is controlled by a logic control signal, such as a CMOS logic control signal, for turning on or turning off the bias current supplied to the RF power amplifier, wherein the bias current will be supplied to the RF power amplifier when the FET is on, and the bias current will not be supplied to the RF power amplifier when the FET is off.

12 Claims, 6 Drawing Sheets

BIAS CIRCUIT BASED ON BIFET TECHNOLOGY FOR SUPPLYING A BIAS CURRENT TO AN RF POWER AMPLIFIER

BACKGROUND OF THE INVENTION

1. Field of the Invention

The invention relates to an RF power amplifier, and in particular but not exclusively to, a bias circuit for supplying a bias current to an RF power amplifier.

2. Description of the Prior Art

Stable bias currents supplied to an RF power amplifier are one of the most important factors for determining the performance of an RF power amplifier. Conventional bias circuits for supplying bias currents to a power amplifier use a transistor switch that is in the conductive path from a reference voltage to the bias circuit for controlling whether to supply a bias current to the power amplifier, and therefore the actual reference voltage supplied to the bias circuit is affected by the voltage drop across the transistor switch, which may cause the bias circuit to operate with an actual reference voltage that is out of the specification.

Therefore, a better solution is needed to resolve the above-mentioned issue.

SUMMARY OF THE INVENTION

One objective of present invention is to provide a bias circuit that comprises a transistor switch for controlling whether to supply a bias current to a power amplifier for ensuring the reference voltage supplied to the bias circuit is not affected by the transistor switch.

In one embodiment, the present invention discloses a bias circuit for supplying a bias current to an RF power amplifier by using a BiFET process, wherein a field-effect transistor is controlled by a logic control signal, which is a digital signal having a "zero" state and a "one" state in contrast to an analog signal, for turning on or turning off the bias current to the RF power amplifier, wherein when the field-effect transistor is on, the bias current will be supplied to the RF power amplifier; and when the field-effect transistor is off, the bias current will not be supplied to the RF power amplifier.

In one embodiment, the present invention discloses a bias circuit for supplying a bias current to an RF power amplifier by using a BiFET process, wherein the bias circuit comprises: a first bipolar transistor, wherein the emitter terminal of the first bipolar transistor is electrically coupled to the RF power amplifier for supplying a bias current to the RF power amplifier; a second bipolar transistor, for outputting a first voltage at the collector terminal of the second bipolar transistor for biasing the base terminal of the first bipolar transistor; and a first field-effect transistor, wherein the collector terminal of the second bipolar transistor is electrically coupled to the base terminal of the first bipolar transistor for providing a second voltage at the base terminal of the first bipolar transistor, wherein the voltage at the gate terminal of the first field-effect transistor is capable of being controlled by a logic control signal for turning on or turning off the first field-effect transistor, wherein when the first field-effect transistor is on, the base terminal of the first bipolar transistor is biased at the second voltage so as to generate the bias current to the RF power amplifier through the emitter terminal of the first bipolar transistor, wherein the first bipolar transistor, the second bipolar transistor and the first field-effect transistor are integrated on a single-chip integrated circuit.

In one embodiment, the logic control signal is a CMOS logic control signal.

In one embodiment, the bipolar transistor is made by a GaAs heterojunction-bipolar-transistor (HBT) process.

In one embodiment, the first field-effect transistor is a depletion-mode field-effect transistor.

In one embodiment, the first field-effect transistor is an enhancement mode field-effect transistor.

In one embodiment, the single-chip integrated circuit is made by a GaAs BiFET process.

The detailed technology and above preferred embodiments implemented for the present invention are described in the following paragraphs accompanying the appended drawings for people skilled in the art to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF EMBODIMENT

The detailed explanation of the present invention is described as follows. The described preferred embodiments are presented for purposes of illustrations and description, and they are not intended to limit the scope of the present invention.

Figure 1:
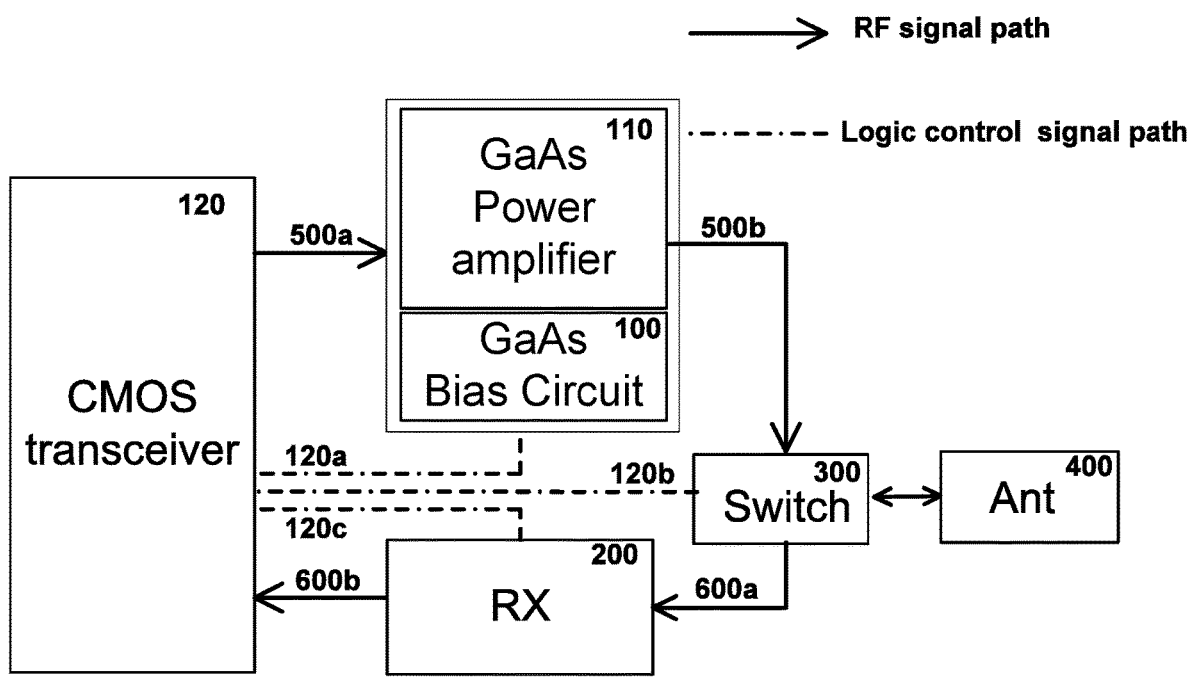
FIG. 1 illustrates a block diagram in which a bias circuit is used for supplying a bias current to an RF power amplifier in accordance with one embodiment of the present invention.

FIG. 1 illustrates a block diagram in which a bias circuit is used for supplying a bias current to an RF power amplifier in accordance with one embodiment of the present invention. As shown in FIG. 1, a bias circuit 100 is used for supplying a bias current to an RF power amplifier 110, wherein the bias circuit 100 is capable of being controlled by a logic control signal 120a that is generated from a CMOS transceiver 120 for enabling the bias circuit 100 to supply a bias current to the RF power amplifier 110. The CMOS transceiver 120 can also control a switch 300 through a logic control signal 120b for either connecting the RF power amplifier 110 to an antenna 400 for transmitting RF signals from a data path 500a to a data path 500b or connecting the antenna 400 to a receiver (RX) 200 for receiving RF signals from a data path 600a to a data path 600b. The CMOS transceiver 120 can also control the receiver (RX) 200 via the logic control signal 120c.

The present invention discloses a number of bias circuits, as shown in FIGS. 2A-2D, for supplying bias currents to the RF power amplifier 110, wherein the bias circuits can be based on a GaAs BiFET process. Each bias circuit can include a current mirror device, an emitter follower buffer, a depletion-mode field-effect transistor (DFET), as well as an enhancement-mode field-effect transistor (EFET). The current mirror device can be configured to provide a reference voltage to bias the RF power amplifier 110 through emitter follower buffer, wherein each of the DFET and the EFET functions as a switch for turning on or turning off the bias currents to the RF power amplifier 110.

Figure 2A:
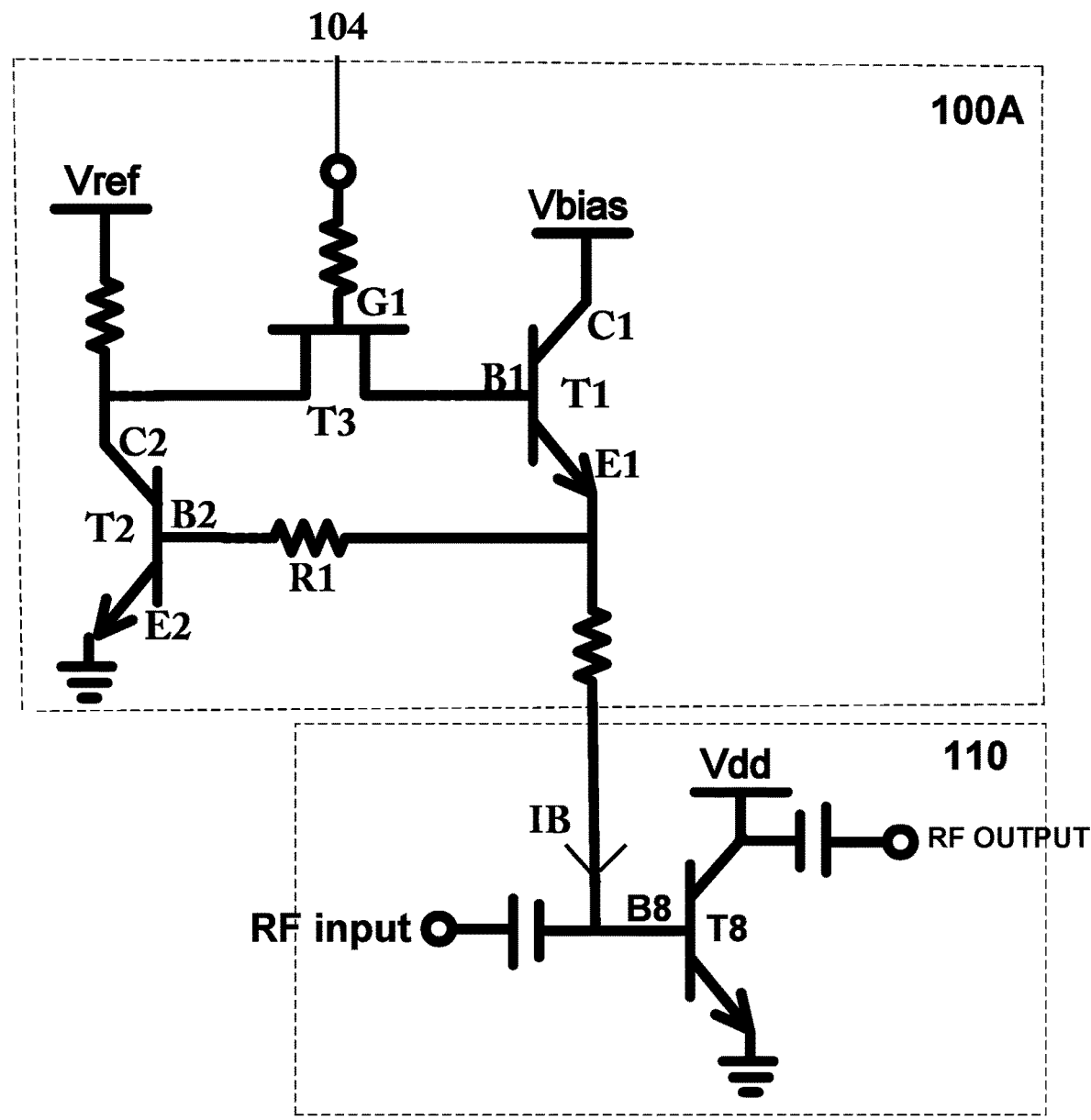
FIGS. 2A-2E each illustrate an exemplary circuit of the bias current in FIG. 1.

FIG. 2A illustrates a bias circuit 100A for supplying a bias current IB to an RF power amplifier 110 in accordance with one embodiment of the present invention, wherein the RF power amplifier 110 comprises a bipolar transistor T8 for generating an RF output according to an RF input when the bias current IB is supplied to the base terminal B8 of the bipolar transistor T8, wherein the collector of the bipolar transistor T8 is coupled to a voltage supply Vdd and the emitter of the bipolar transistor T8 is coupled to a ground. As shown in FIG. 2A, the bias circuit is on a single-chip integrated circuit and comprises: a first bipolar transistor T1 having a base terminal B1, a collector terminal C1 coupled to a voltage supply Vbias and an emitter terminal E1, wherein the emitter terminal E1 of the first bipolar transistor T1 is electrically coupled to the base terminal B8 of the bipolar transistor T8 of the RF power amplifier 110; a reference voltage generator circuit comprising a second bipolar transistor T2 for outputting a first voltage at the collector terminal C2 of the second bipolar transistor T2, wherein the collector terminal C2 of the second bipolar transistor T2 is coupled to a voltage supply Vref; and a first field-effect transistor T3, wherein the base terminal B1 of the first bipolar transistor T1 is electrically coupled to the collector terminal C2 of a second bipolar transistor T2 via the channel path of the first field-effect transistor T3, wherein the voltage at the gate terminal G1 of the first field-effect transistor T3 is capable of being controlled by a logic control signal 104 for turning on or turning off the first field-effect transistor T3, wherein when the first field-effect transistor T3 is turned on, the base terminal B1 of the first bipolar transistor T1 is biased at a second voltage according to the first voltage, so as to generate a bias current IB to the RF power amplifier 110 through the emitter terminal E1 of the first bipolar transistor T1.

In one embodiment, the first field-effect transistor T3 is an enhancement-mode field-effect transistor, wherein the first enhancement-mode field-effect transistor T3 is turned on when the logic control signal 104 is in one state, and the first enhancement-mode field-effect transistor T3 is turned off when the logic control signal 104 is in the other state. For example, if the first field-effect transistor T3 is an N-Channel enhancement-mode field-effect transistor, then the first N-Channel enhancement-mode field-effect transistor T3 is on when the logic control signal 104 is in a "high" state or "one" state, and the first N-Channel enhancement-mode field-effect transistor T3 is off when the logic control signal 104 is in a "low" state or "zero" state.

In one embodiment, the first field-effect transistor T3 is a depletion-mode field-effect transistor, wherein the first depletion-mode field-effect transistor T3 is normally on until the logic control signal 104 is in a corresponding state to turn off the first depletion-mode field-effect transistor T3. For example, if the first depletion-mode field-effect transistor T3 is an N-Channel depletion-mode field-effect transistor, then the first N-Channel depletion-mode field-effect transistor T3 is normally on until the logic control signal 104 is in a "low" state or "zero" state.

In one embodiment, as shown in FIG. 2A, the collector terminal of the second bipolar transistor T2 is electrically coupled to the base terminal B1 of the first bipolar transistor T1 via the channel path of the first depletion-mode field-effect transistor T3. Please note that the channel path of a field-effect transistor refers to the conductive path between the drain terminal and the source terminal of the field-effect transistor, and the direction of the current flow is dependent on the channel type of the field-effect transistor. That is, for a P-channel field-effect transistor, the current flows from the source terminal to the drain terminal; and for an N-channel field-effect transistor, the current flows from the drain terminal to the source terminal.

In one embodiment, as shown in FIG. 2A, the base terminal B2 of the second bipolar transistor T2 can be electrically coupled to the emitter terminal E1 of the first bipolar transistor T1 via a resistor R1.

Figure 2B:
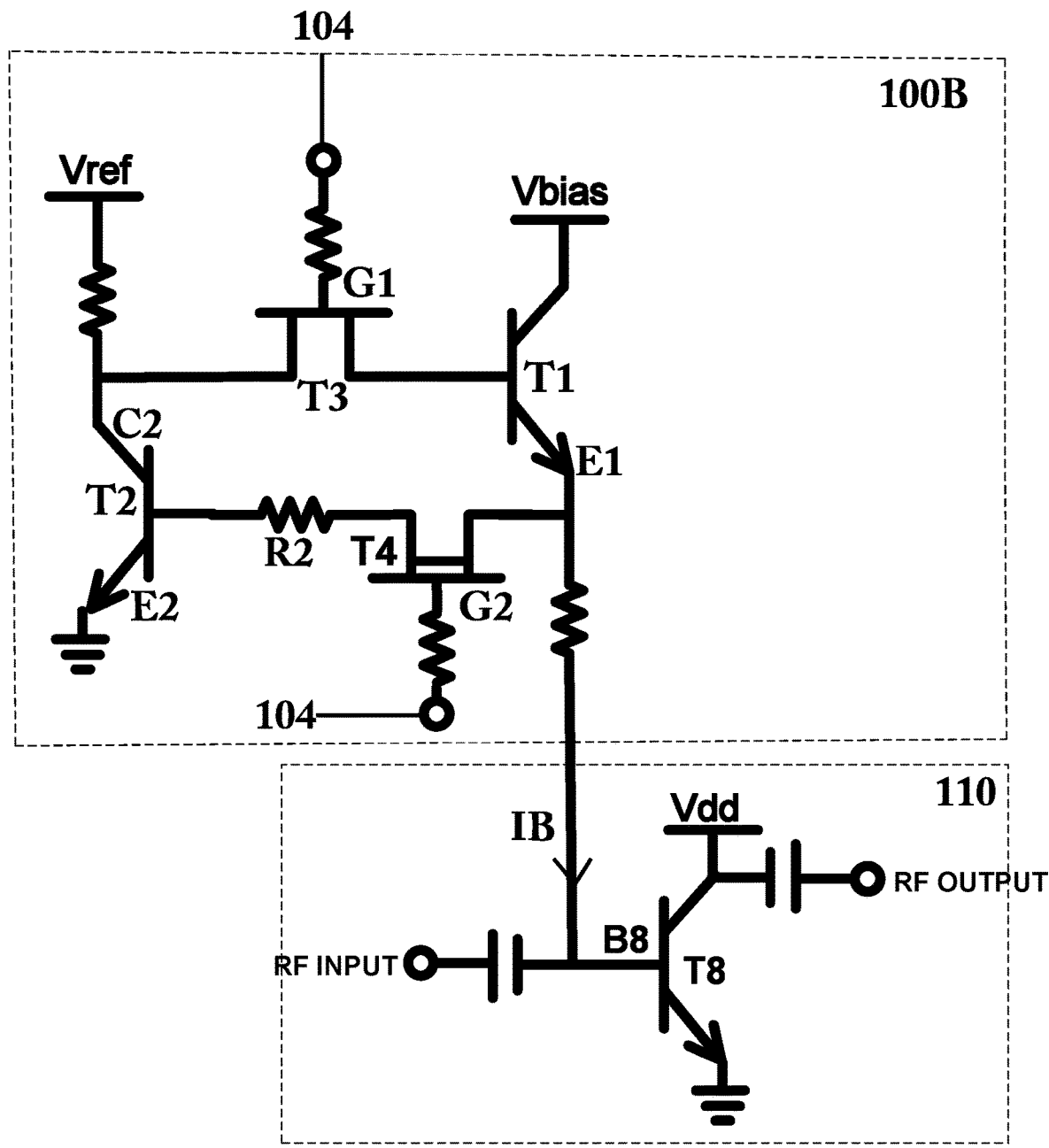

FIG. 2B illustrates a bias circuit 100B for supplying a bias current IB to an RF power amplifier 110 in accordance with one embodiment of the present invention. As shown in FIG. 2B, the base terminal B2 of the second bipolar transistor T2 is electrically coupled to the emitter terminal E1 of the first bipolar transistor T1 via an enhancement-mode field-effect transistor T4 and a resistor R2 that is connected in series with the channel path of the enhancement-mode field-effect transistor T4, wherein the voltage at the gate terminal G2 of the enhancement-mode field-effect transistor T4 is capable of being controlled by said logic control signal 104 for turning on or turning off the enhancement-mode field-effect transistor T4, as shown in FIG. 2B.

Figure 2C:
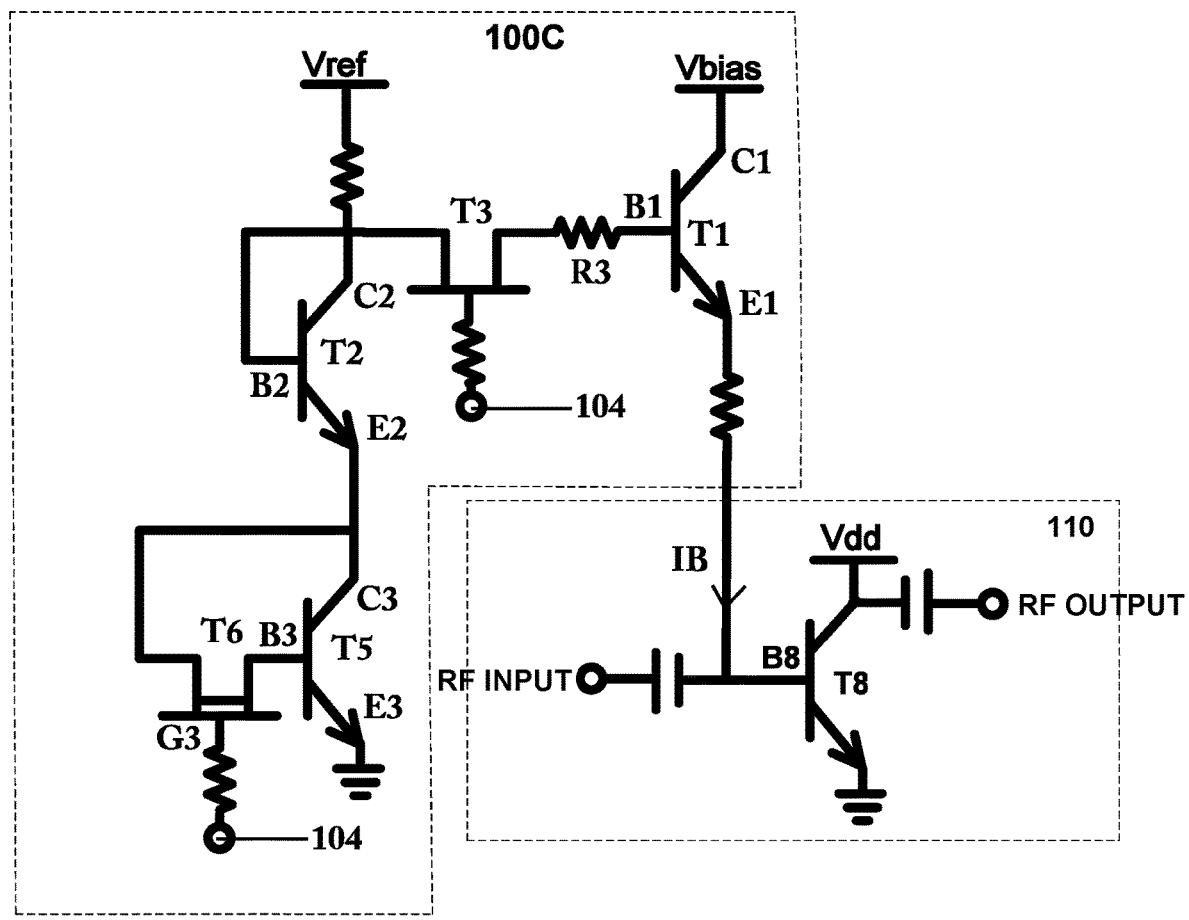

FIG. 2C illustrates a bias circuit 100C for supplying a bias current IB to an RF power amplifier 110 in accordance with one embodiment of the present invention. As shown in FIG. 2C, the base terminal B1 of the first bipolar transistor T1 is electrically coupled to the collector terminal C2 of the second bipolar transistor T2 via the channel path of the first depletion-mode field-effect transistor T3 and a resistor R2 that is connected in series with the channel path of the first depletion-mode field-effect transistor T3.

In one embodiment, as shown in FIG. 2C, the base terminal of the second bipolar transistor T2 is electrically coupled to the collector terminal C2 of the second bipolar transistor T2, wherein the emitter terminal E2 of the second bipolar transistor T2 is electrically coupled to the collector terminal C3 of a third bipolar transistor T5, wherein the collector C3 of the third bipolar transistor T5 is electrically coupled to the channel path of an enhancement-mode field-effect transistor T6, wherein the voltage at the gate terminal G3 of the enhancement-mode field-effect transistor T6 is capable of being controlled by said logic control signal 104 for turning on or turning off the enhancement-mode field-effect transistor T6.

Figure 2D:
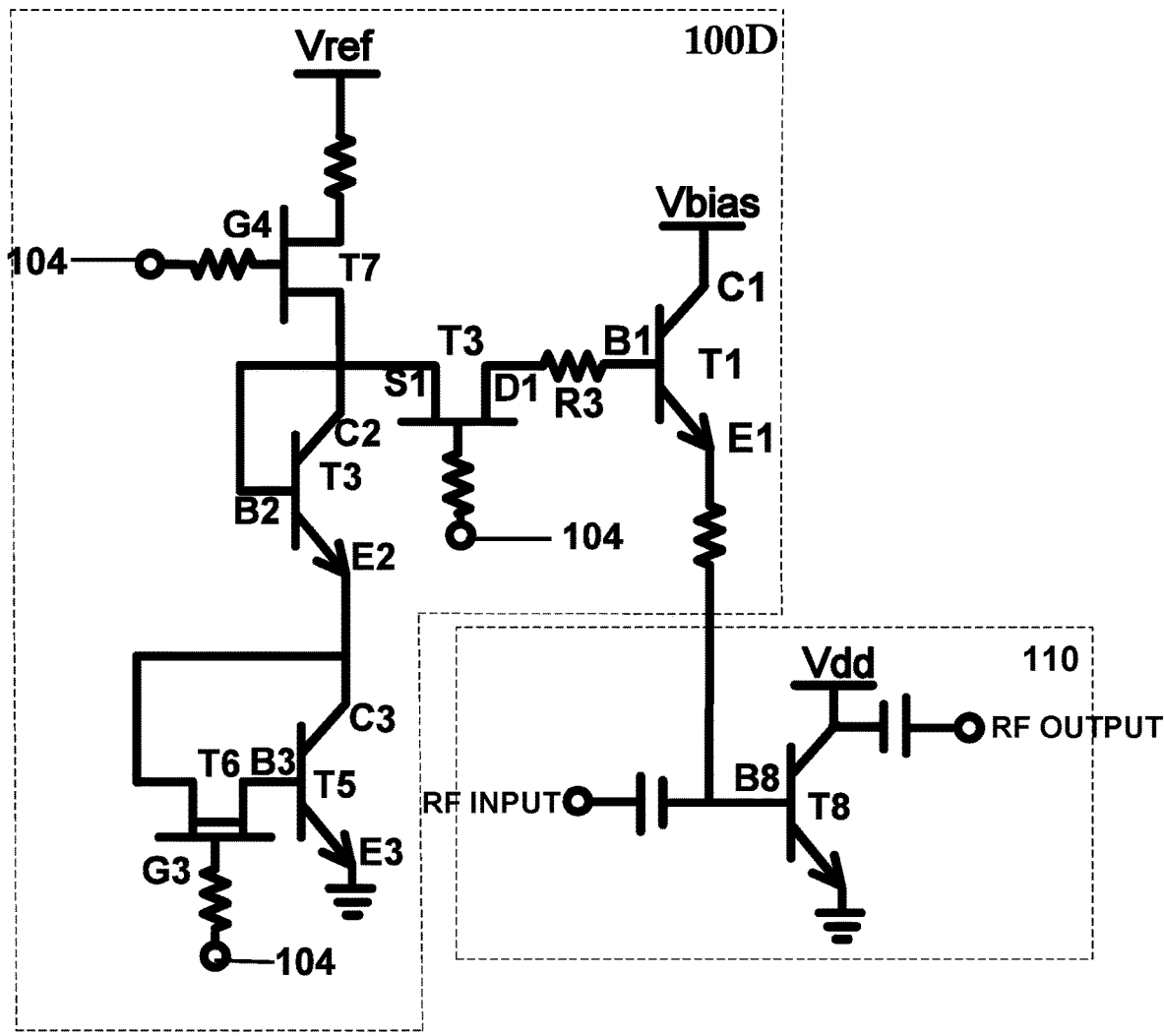

FIG. 2D illustrates a bias circuit 100D for supplying a bias current IB to an RF power amplifier 110 in accordance with one embodiment of the present invention. As shown in FIG. 2D, the collector terminal C2 of the second bipolar transistor T2 is electrically coupled to the channel path of a depletion-mode field-effect transistor T7, wherein the voltage at the gate terminal G4 of the depletion-mode field-effect transistor T7 is capable of being controlled by said logic control signal 104 for turning on or turning off the depletion-mode field-effect transistor T7, as shown in FIG. 2D.

Figure 2E:
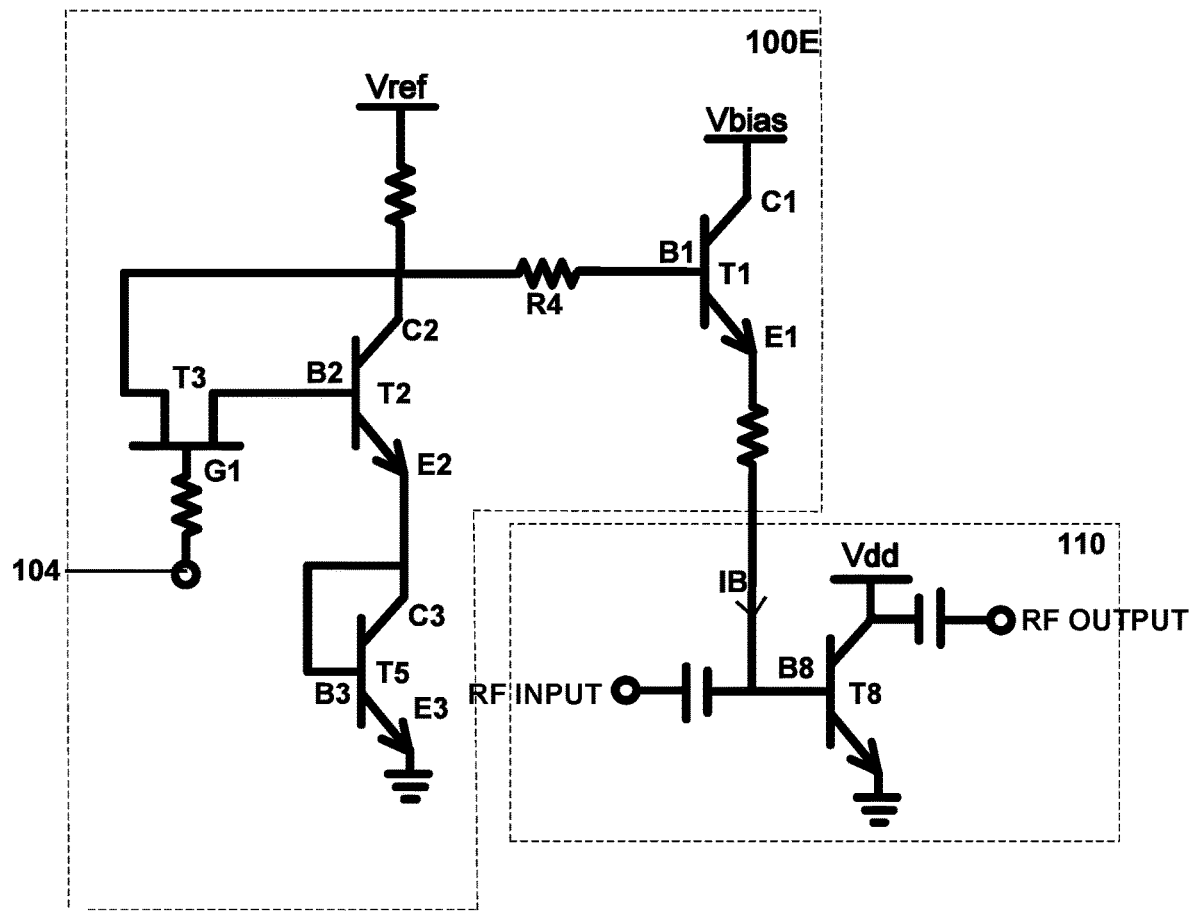

FIG. 2E illustrates a bias circuit 100E for supplying a bias current to an RF power amplifier 110 in accordance with one embodiment of the present invention, wherein the bias circuit comprises: a first bipolar transistor T1 having a base terminal B1, a collector terminal C1 and an emitter terminal E1, wherein the emitter terminal E1 of the first bipolar transistor T1 is electrically coupled to the RF power amplifier 110; a second bipolar transistor T2 for outputting a first voltage at the collector terminal C2 of the second bipolar transistor T2; and a first depletion-mode field-effect transistor T3, wherein the collector terminal C2 of a second bipolar transistor T2 is electrically coupled to the base terminal B1 of the first bipolar transistor T1 via a resistor R3 for providing a second voltage at the base terminal B1 of the first bipolar transistor T1, and the base terminal B2 of the second bipolar transistor T2 is electrically coupled to the collector terminal C2 of the second bipolar transistor T2 via the channel path of the first depletion-mode field-effect transistor T3, wherein the voltage at the gate terminal G1 of the first depletion-mode field-effect transistor T3 is capable of being controlled by a logic control signal 104 for turning on or turning off the first depletion-mode field-effect transistor T3, wherein when the first depletion-mode field-effect transistor T3 is on, the base terminal B1 of the first bipolar transistor T1 is biased at the second voltage so as to generate the bias current IB to the RF power amplifier 110 through the emitter terminal E1 of the first bipolar transistor T1.

In one embodiment, as shown in FIG. 2E, the emitter terminal E2 of the second bipolar transistor T2 is electrically coupled to the collector terminal C3 of a third bipolar transistor T5, the collector C3 of the third bipolar transistor T5 is electrically connected to the base terminal B3 of the third bipolar transistor T5, and the emitter terminal E3 of the third bipolar transistor T5 is electrically coupled to the ground.

In one embodiment of the present invention, the logic control signal 104 of the present invention is a CMOS logic control signal.

In one embodiment of the present invention, the logic control signal 104 of the present invention is a low-current logic control signal.

In one embodiment of the present invention, the logic control signal 104 of the present invention is a CMOS low-current logic control signal.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A bias circuit for supplying a bias current to an RF power amplifier, said bias circuit comprising:
    a first bipolar transistor, wherein the emitter terminal of the first bipolar transistor is electrically coupled to the RF power amplifier for supplying a bias current to the RF power amplifier;
    a second bipolar transistor, for outputting a first voltage at the collector terminal of the second bipolar transistor for biasing the base terminal of the first bipolar transistor; and
    a first enhancement-mode field-effect transistor, wherein the collector terminal of the second bipolar transistor is electrically coupled to the base terminal of the first bipolar transistor via a conductive path comprising the first enhancement-mode field-effect transistor for providing a second voltage at the base terminal of the first bipolar transistor, wherein the voltage at the gate terminal of the first enhancement-mode field-effect transistor is capable of being controlled by a logic control signal for turning on or turning off the first enhancement-mode field-effect transistor, wherein when the first enhancement-mode field-effect transistor is on, the base terminal of the first bipolar transistor is biased at the second voltage so as to generate the bias current to the RF power amplifier through the emitter terminal of the first bipolar transistor, wherein the first bipolar transistor, the second bipolar transistor and the first enhancement-mode field-effect transistor are integrated on a single-chip integrated circuit.

2. The bias circuit of claim 1, wherein the conductive path further comprises a resistor that is connected in series with the first enhancement-mode field-effect transistor.

3. The bias circuit of claim 1, wherein the logic control signal is a CMOS logic control signal.

4. The bias circuit of claim 1, wherein the single-chip integrated circuit is made by a GaAs BiFET process.

5. The bias circuit of claim 1, wherein the first bipolar transistor is made by a GaAs heterojunction-bipolar-transistor (HBT) process.

6. A bias circuit for supplying a bias current to an RF power amplifier, said bias circuit comprising:
    a first bipolar transistor, wherein the emitter terminal of the first bipolar transistor is electrically coupled to the RF power amplifier for supplying a bias current to the RF power amplifier;
    a second bipolar transistor, for outputting a first voltage at the collector terminal of the second bipolar transistor for biasing the base terminal of the first bipolar transistor; and
    a first depletion-mode field-effect transistor, wherein the collector terminal of the second bipolar transistor is electrically coupled to the base terminal of the first bipolar transistor via a conductive path comprising the first depletion-mode field-effect transistor for providing a second voltage at the base terminal of the first bipolar transistor, wherein the voltage at the gate terminal of the first depletion-mode field-effect transistor is capable of being controlled by a logic control signal for turning on or turning off the first depletion-mode field-effect transistor, wherein when the first depletion-mode field-effect transistor is on, the base terminal of the first bipolar transistor is biased at the second voltage so as to generate the bias current to the RF power amplifier through the emitter terminal of the first bipolar transistor, wherein the first bipolar transistor, the second bipolar transistor and the first depletion-mode field-effect transistor are integrated on a single-chip integrated circuit.

7. The bias circuit of claim 6, wherein the logic control signal is a CMOS logic control signal.

8. The bias circuit of claim 6, wherein the single-chip integrated circuit is made by a GaAs BiFET process.

9. The bias circuit of claim 6, wherein the first bipolar transistor is made by a GaAs heterojunction-bipolar-transistor (HBT) process.

10. A bias circuit for supplying a bias current to an RF power amplifier, said bias circuit comprising:
    a first bipolar transistor, wherein the emitter terminal of the first bipolar transistor is electrically coupled to the RF power amplifier for supplying a bias current to the RF power amplifier;
    a second bipolar transistor, for outputting a first voltage at the collector terminal of the second bipolar transistor for biasing the base terminal of the first bipolar transistor; and
    a first field-effect transistor, wherein the collector terminal of the second bipolar transistor is electrically coupled to the base terminal of the first bipolar transistor for providing a second voltage at the base terminal of the first bipolar transistor, wherein the voltage at the gate terminal of the first field-effect transistor is capable of being controlled by a logic control signal for turning on or turning off the first field-effect transistor, wherein when the first field-effect transistor is on, the base terminal of the first bipolar transistor is biased at the second voltage so as to generate the bias current to the RF power amplifier through the emitter terminal of the first bipolar transistor, wherein the first bipolar transistor, the second bipolar transistor and the first field-effect transistor are integrated on a single-chip integrated circuit, wherein the collector terminal of the second bipolar transistor is electrically coupled to the base terminal of the first bipolar transistor via a conductive path comprising a resistor, wherein the collector terminal of the second bipolar transistor is electrically coupled to the base terminal of the second bipolar transistor via the first field-effect transistor for providing said second voltage at the base terminal of the first bipolar transistor.

11. The bias circuit of claim 10, wherein the first field-effect transistor is a first depletion-mode field-effect transistor.

12. The bias circuit of claim 10, wherein the first field-effect transistor is a first enhancement-mode field-effect transistor.

\* \* \* \* \*